United States Patent
Thomsen et al.

(10) Patent No.: US 9,935,649 B1
(45) Date of Patent: Apr. 3, 2018

(54) LOW POWER QUANTIZER WITH PASSIVE SUMMERS AND INTERPOLATED DYNAMIC COMPARATORS

(71) Applicant: SILICON LABORATORIES INC., Austin, TX (US)

(72) Inventors: Axel Thomsen, Austin, TX (US); Chao Yang, Austin, TX (US); Xiaodong Wang, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/681,710

(22) Filed: Aug. 21, 2017

(51) Int. Cl.
| | |
|---|---|
| *H03M 3/00* | (2006.01) |
| *H03M 1/36* | (2006.01) |
| *H03K 5/24* | (2006.01) |
| *H03M 1/00* | (2006.01) |
| *H03M 1/08* | (2006.01) |

(52) U.S. Cl.
CPC .............. *H03M 3/452* (2013.01); *H03K 5/24* (2013.01); *H03M 1/002* (2013.01); *H03M 1/368* (2013.01); *H03M 1/0854* (2013.01)

(58) Field of Classification Search
None
See application file for complete search history.

(56) References Cited

U.S. PATENT DOCUMENTS

| | | | | |
|---|---|---|---|---|
| 5,157,397 A * | 10/1992 | Vernon | ................. | H03M 1/365 341/118 |
| 5,291,198 A * | 3/1994 | Dingwall | .............. | H03M 1/204 341/156 |
| 6,107,947 A * | 8/2000 | Lyden | ................... | H03M 3/466 341/143 |
| 9,100,041 B1 * | 8/2015 | Richardson | ........... | H03M 3/464 |

* cited by examiner

*Primary Examiner* — Howard Williams
(74) *Attorney, Agent, or Firm* — Gary Stanford; Huffman Law Group, PC (57) ABSTRACT

A quantizer including passive summers, dynamic comparators and a clock generator. Each passive summer samples the input voltages and a reference voltage scaled by one of multiple graduated gains, and subtracts the scaled reference voltage from the sum of the input voltages. The graduated gains divide a predetermined voltage range into multiple voltage subranges, each between sequential pairs of the passive summers. The dynamic comparators compare each sequential pair of passive summer output voltages according to multiple splitting ratios and provide corresponding quantization bits. The dynamic comparators are activated in groups to reduce comparator kickback. Each dynamic comparator recharges the passive summer output voltages coupled to its inputs back to their initial voltage values to reduce kickback residual. The passive summers eliminate the need for a resistor string to generate the reference voltages. Staggered activation and comparator recharging replace preamplifiers used to suppress kickback and kickback residuals.

20 Claims, 6 Drawing Sheets

LOW POWER QUANTIZER WITH PASSIVE SUMMERS AND INTERPOLATED DYNAMIC COMPARATORS

BACKGROUND OF THE INVENTION

Field of the Invention

The present invention relates in general to quantization, and more particularly, to a low power quantizer with switched capacitor passive summers and interpolated dynamic comparators.

Description of the Related Art

In the realm of signal processing, an analog to digital converter (ADC) converts an input analog value into a corresponding output digital value. An ADC may be modeled as performing two processes, including sampling and quantization. Quantization is the process of converting a large set of input values to a smaller or finite set of quantized values. For example, an input analog signal is sampled at a selected rate, and each sample is quantized or converted into one of a set of quantization values. A quantizer may be used, for example, within a delta-sigma ($\Delta\Sigma$) modulator as part of an incremental ADC (IADC).

At least one conventional quantizer uses a resistor string and a set of conventional comparators. The resistor string is energized within a reference voltage range to generate multiple discrete reference voltages, in which each comparator converts the difference between the input and one of the discrete reference voltages into a binary value. The collective set of binary values is typically in the form of a thermometer code, which may be converted to a corresponding digital number. The conventional design may further include a set of preamplifiers that protect the weak reference voltages by suppressing comparator kickback. Comparator kickback modifies the input signal thereby introducing errors to other comparators, which would significantly increase quantization error if not suppressed to a significant degree. The resistor string and the preamplifiers increase both circuit size and the power consumption of the conventional quantizer.

SUMMARY OF THE INVENTION

A quantizer according to one embodiment includes passive summers, dynamic comparators and a clock generator. Each passive summer is configured to sum multiple input voltages while subtracting a scaled reference voltage to provide a corresponding one of multiple output voltages. The reference voltage is scaled by one of several graduated gains that divide a predetermined voltage range into multiple voltage subranges, in which each voltage subrange is defined between a sequential pair of output voltages of the passive summers. The dynamic comparators are organized into both interpolated sets and groups, in which each group uses one of the splitting ratios. Each interpolated set of dynamic comparators compares a pair of output voltages from a corresponding sequential pair of the passive summers according to multiple splitting ratios. Each dynamic comparator generates one of a set of quantization bits for each voltage subrange. Each dynamic comparator, when activated to compare the pair of output voltages, recharges a charge node coupled to the pair of passive summer output voltages to return the pair of output voltages to initial voltages to minimize or even eliminate kickback residual. The clock generator transitions each of the passive summers through a first phase and then a second phase of each quantization cycle, and generates staggered clock signals that activate each group of dynamic comparators one group at a time during the second phase to develop the quantization bits. The staggered activation of the dynamic comparator groups further minimize the effects of comparator kickback.

The graduated gains may be equally spaced to divide the predetermined voltage range into equally spaced voltage subranges, and the splitting ratios may equally divide each voltage subrange into equally spaced quantization levels.

Each passive summer may include a positive polarity output node and a negative polarity output node, a reset switch, and one or more switched capacitor sample channels. The reset switch circuit couples a common mode voltage node to the positive and negative polarity output nodes during the first phase, and decouples the common mode voltage node from the positive and negative polarity output nodes during the second phase. Each switched capacitor sample channel includes positive and negative sample capacitors, and positive and negative channel switch circuits. The positive sample capacitor is coupled between a first node and the positive polarity output node, and the negative sample capacitor is coupled between the second node and the negative polarity output node. The positive channel switch circuit couples a first polarity of a corresponding input voltage to the first node during the first phase and couples a second polarity of a corresponding input voltage to the first node during the second phase. The negative channel switch circuit couples the second polarity of a corresponding input voltage to the second node during the first phase, and couples the first polarity of the corresponding input voltage to the second node during the second phase.

The switched capacitor sample channels may include a reference channel receiving the reference voltage. The graduated gains may be determined by selecting a capacitance value of the first and second channel capacitors of the reference channel and by selecting a polarity of the reference voltage. The graduated gains may be determined by selecting at least one multiple of a unit capacitance and by selecting a polarity of the reference voltage.

Each staggered clock signal activates one group of dynamic comparators at a time, and each subsequent group is activated after comparisons performed by dynamic comparators of a previously activated group have completed. The splitting ratios may be implemented by coupling a ratio of outputs of a sequential pair of passive summers to the inputs of the dynamic comparator. For example, an output of a first passive summer is coupled to a first number of inputs of a dynamic comparator, and an output of a second passive summer is coupled to a second number of inputs of the dynamic comparator, in which the first and second numbers are selected according to a corresponding splitting ratio.

Each dynamic comparator may include input transistors, a charge and a discharge device, and a controller to minimize kickback residual. Each input transistor has a current path coupled between a charge node and a preliminary output node, and each transistor has a control terminal receiving a passive summer output. The charge device is coupled between an upper source voltage node and the charge node, and the discharge device is coupled between the preliminary output node and a lower source voltage node. The controller turns off the charge device and turns on the discharge device during a reset period to reduce a voltage of the charge node during the reset period, and turns on the charge device and turns off the discharge device to pull the voltage of the charge node to a voltage of the upper source node during the compare period after the reset period. A voltage of a passive summer output is modified from an initial value by a corresponding input transistor during the reset period, and is returned to its initial value by the an end of the compare period when charge node is pulled to the voltage of the upper source node.

A method of summing and quantizing input voltages according to one embodiment includes, for each of multiple graduated gains, scaling a reference voltage by a corresponding graduated gain, summing the input voltages while subtracting a corresponding scaled reference voltage to provide a corresponding output voltage, in which the graduated gains divide a predetermined voltage range into multiple voltage subranges each defined between a corresponding sequential pair of the output voltages, and, for each sequential pair of the output voltages, comparing the sequential pair of output voltages according a splitting ratio to provide a corresponding quantization bit for a corresponding voltage subrange, repeating the comparing for every other one of multiple splitting ratios after each of multiple staggered time periods, and for each comparing for each splitting ratio, recharging a charge node coupled to the sequential pair of output voltages to minimize any change of the sequential pair of output voltages.

The method may include sampling a first polarity of each input voltage with a corresponding capacitor referenced to a common mode voltage during a first phase, and sampling a second polarity of each input voltage with the corresponding capacitor during a second phase. The method may further include sampling a selected one of positive and negative polarities of the reference voltage by capacitor having a selected capacitance referenced to the common mode voltage during the first phase, and sampling the other polarity of the reference voltage by the capacitor during the second phase. The method may include selecting a polarity of the reference voltage and selecting a multiple of a unit capacitance for sampling the reference voltage.

The method may include charging each of multiple sample capacitors with a difference between a common mode voltage and a voltage of a first polarity of a corresponding input voltage during a first phase, and then adding a voltage of a second polarity of the corresponding input voltage to a corresponding sample capacitor during a second phase.

The method may include comparing a first number of a first one of the sequential pair of output voltages with a second number of a second one of the sequential pair of output voltages. The method may include determining splitting ratios by adjusting a ratio between the first and second numbers.

The method may include coupling the sequential pair of output voltages to control terminals of transistor devices having current terminals coupled in a charge path coupled to the charge node, discharging the charge node during a reset period, recharging the charge node during a compare period, and holding the charge node charged during a hold period until after the staggered time periods have completed.

The method may include selecting the graduated gains to equally divide the predetermined voltage range into equal voltage subranges, and selecting the splitting ratios to divide each voltage subrange into equally spaced quantization levels.

BRIEF DESCRIPTION OF THE DRAWINGS

The present invention is illustrated by way of example and not limited by the accompanying figures, in which like references indicate similar elements. Elements in the figures are illustrated for simplicity and clarity and have not necessarily been drawn to scale.

DETAILED DESCRIPTION

The inventors have recognized the need to reduce the amount of circuit space and power consumption for summing and quantizing input voltages. They have therefore developed a low power quantizer with passive summers and interpolated dynamic comparators. The passive summers are configured as switched capacitor circuits that sum the input voltages together with a reference voltage scaled by one of multiple graduated gains for dividing a predetermined overall voltage range into multiple voltage subranges. The dynamic comparators are organized into multiple interpolated sets of dynamic comparators in which each interpolated set compares outputs of a corresponding sequential pair of the passive summers according to corresponding splitting ratios. The splitting ratios are varied for each dynamic comparator of each set to interpolate each voltage subrange into multiple quantization levels. The dynamic comparators are further divided into groups, in which each group is activated one at a time by staggered clock signals to reduce comparator kickback. Furthermore, each dynamic comparator is configured with a windowed reset to eliminate kickback residuals from one comparator group to the next. A summing quantizer implemented according to the present invention eliminates the use of resistor strings to generate reference voltages and further eliminates the need for preamplifiers to suppress comparator kickback.

Figure 1:
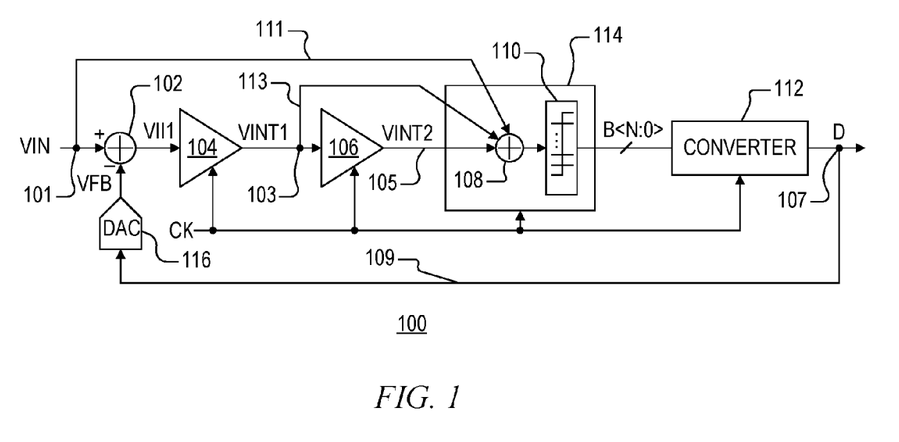
FIG. 1 is a simplified block diagram of a second-order delta-sigma ($\Delta\Sigma$) modulator incorporating a summing quantizer implemented according to one embodiment of the present invention.

FIG. 1 is a simplified block diagram of a second-order delta-sigma ($\Delta\Sigma$) modulator 100 incorporating a summing quantizer 114 implemented according to one embodiment of the present invention. In the illustrated embodiment, the ΔΣ modulator 100 includes a first analog adder 102, a first integrator 104, a second integrator 106, a second analog adder 108, a quantizer 110, a converter 112, and a digital-to-analog converter (DAC) 116. In the illustrated embodiment, the adder 108 is incorporated into the quantizer 110 and collectively referred to as the summing quantizer 114, where it is understood that the summing quantizer 114 quantizes a sum of one or more voltages in the ΔΣ modulator 100. The present invention is not limited to ΔΣ modulators or the particular configuration of the ΔΣ modulator 100, but may be used in any application in which quantization is performed. The order of the ΔΣ modulator 100 corresponds to the number of integrators, in which the illustrated ΔΣ modulator 100 has two analog integrators and thus is referred to as a second-order modulator.

In the illustrated embodiment, an analog input voltage (VIN) is provided via an input node 101 to one input of the adder 102, which has another input receiving an analog feedback voltage (VFB) from an output of the DAC 116. The adder 102 subtracts VFB from VIN and provides a difference voltage VII1 (or VII1=VIN−VFB) to an input of the first integrator 104. The integrator 104 has an output providing a first integrated voltage (VINT1) on a node 103, which is coupled to an input of the second integrator 106. The integrator 106 has an output providing a second integrated voltage (VINT2) on a node 105, which is coupled to one input of the adder 108. A feed-forward path 111 provides VIN to a second input of the adder 108. Another feed-forward path 113 provides VINT1 to a third input of the adder 108. The adder 108 develops a sum voltage at its output, which is provided to an input of the quantizer 110. As described further below, the summing quantizer 114 sums together the voltages VIN, VINT1 and VINT2 and quantizes the sum into a set of quantized values in the form of a set of N+1 binary values or "bits" B<N:0> in which "N" is any suitable positive integer. The summing quantizer 114 provides the bits B<N:0> to the converter 112, which converts the bits to a digital output sample D on an output node 107. A feedback path 109 is coupled between node 107 and an input of the DAC 116, which converts the digital output sample D to the feedback voltage VFB provided to the negative or subtracting input of the adder 102. A clock signal CK is provided to the integrators 104 and 106, to the summing quantizer 114 and to the converter 112 to regulate timing of the digital output samples D.

The ΔΣ modulator 100 is not further described, yet illustrates one application of the summing quantizer 114. Although not shown, the ΔΣ modulator 100 may be incorporated into a larger function, such as an incremental analog-to-digital converter (ADC) or the like. Also, the summing quantizer 114 may be implemented within other applications in which quantization is performed. The signals VIN, VINT1 and VINT2 may be differential signals as further described herein, although any one or more of the signals input to the adder 108 may be implemented as single-ended signals.

Figure 2:
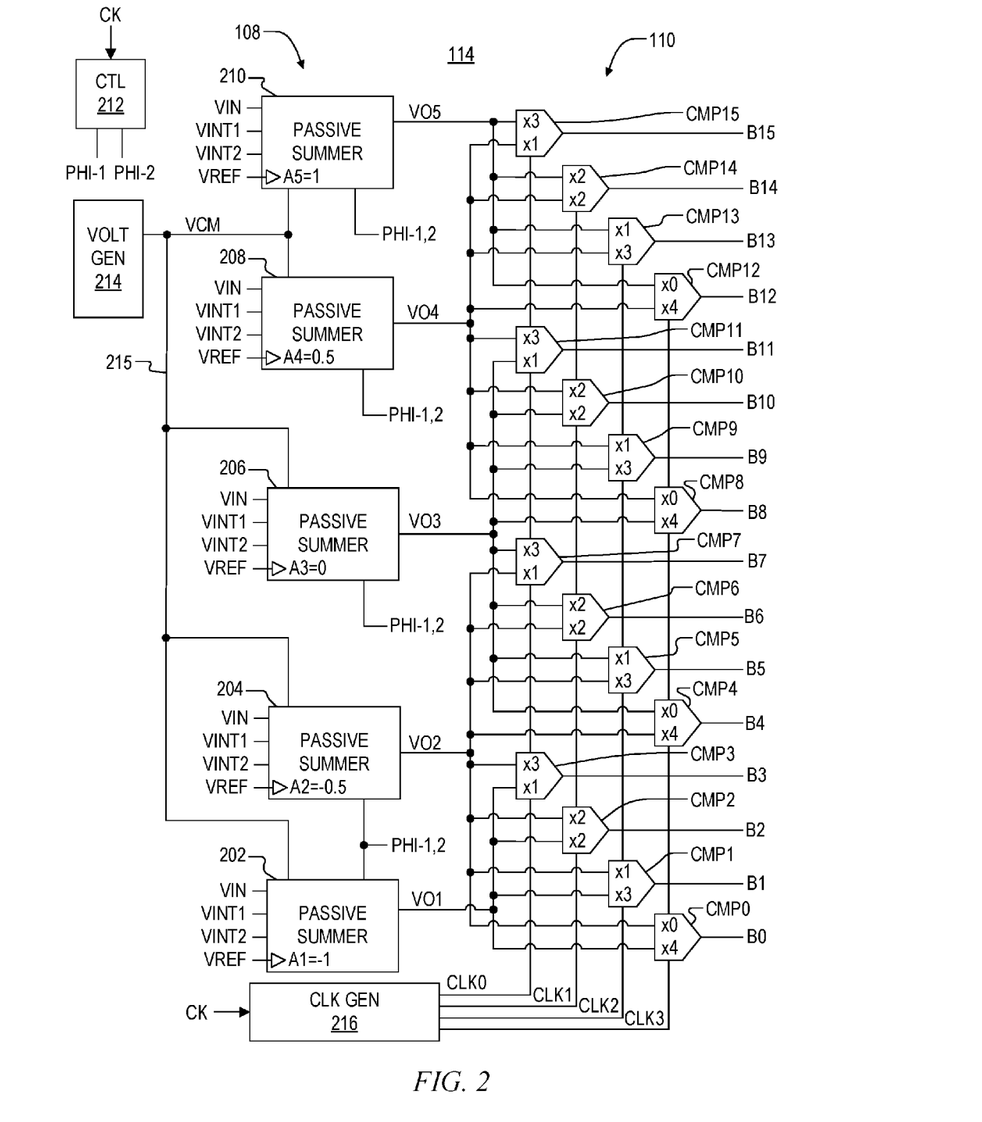
FIG. 2 is a simplified block diagram of the summing quantizer of FIG. 1 implemented according to one embodiment of the present invention providing the set of quantized output bits.

FIG. 2 is a simplified block diagram of the summing quantizer 114 implemented according to one embodiment of the present invention providing the set of quantized output bits B<15:0> for the case in which N=15. The summing quantizer 114 includes a series of 5 passive summers 202, 204, 206, 208, and 210 implementing the adder 108, and a set of 16 dynamic dynamic comparators CMP0, CMP1, CMP2, . . . , CMP15 (CMP0-CMP15) implementing the quantizer 110. The summing quantizer 114 also includes a controller (CTL) 212 receiving the clock signal CK and providing a pair of phase signals PHI-1 and PHI-2 to each of the passive summers 202-210, a voltage generator 214 providing a common mode voltage VCM to each of the passive summers 202-210 via a common mode (CM) voltage node 215, and a clock generator 216 receiving CK and providing 4 clock signals CLK0, CLK1, CLK2 and CLK3 (CLK0-CLK3). The clock generator 216 staggers the clock signals CLK0-CLK3 for sequentially clocking the dynamic comparators CMP0-CMP15 one group at a time during assertion of PHI-2 as further described herein.

Each of the passive summers 202-210 receives the voltages VIN, VINT1, VINT2 and a reference voltage VREF and provides a corresponding one of five output voltages VO1, VO2, VO3, VO4, and VO5 (VO1-VO5). Each of the passive summers 202-210 applies a different one of graduated gains "A" to VREF, and then subtracts the scaled VREF value from the sum of other voltages VIN, VINT1 and VINT2 to provide the corresponding one of the output voltages VO1-VO5, or VOX=VIN+VINT1+VIN2−AX*VREF in which X denotes an index from 1 to 5. As shown, the passive summer 202 applies a gain of A1=−1 to VREF and outputs VO1, the passive summer 204 applies a gain of A2=−0.5 to VREF and outputs VO2, the passive summer 206 applies a gain of A3=0 to VREF and outputs VO3, the passive summer 202 applies a gain of A4=+0.5 to VREF and outputs VO4, and the passive summer 210 applies a gain of A5=+1 to VREF and outputs VO5. The set of graduated gains from −1 to +1 effectively define a range of −VREF to +VREF for an overall voltage range of 2*VREF. The overall voltage range is divided into 4 voltage subranges in which each voltage subrange is defined between a corresponding sequential pair of the passive summers 202-210. The voltage subranges include a first voltage subrange from −VREF to −0.5 VREF (between passive summers 202 and 204), a second voltage subrange from −0.5 VREF to 0 (between passive summers 204 and 206), a third voltage subrange from 0 to 0.5 VREF (between passive summers 206 and 208), and a fourth voltage from 0.5 VREF to VREF (between passive summers 208 and 210).

The dynamic comparators CMP0-CMP15 are organized into multiple sets of dynamic comparators in which each set interpolates the outputs of a corresponding successive pair of the passive summers 202-210 according to multiple splitting ratios to provide corresponding quantized levels or bits. The comparators CMP0-CMP3 form a first set for interpolating the outputs VO1 and VO2, the comparators CMP4-CMP7 form a second set for interpolating the outputs VO2 and VO3, the comparators CMP8-CMP11 form a third set for interpolating the outputs VO3 and VO4, and the comparators CMP12-CMP15 form a fourth set for interpolating the outputs VO4 and VO5. VO1 is provided to a first input and VO2 is provided to a second input of each of the first set of dynamic comparators CMP0-CMP3, which provide corresponding bits B0, B1, B2 and B3 (or B<3:0>), respectively. Similarly, VO2 is provided to a first input and VO3 is provided to a second input of each of the second set of dynamic comparators CMP4-CMP7, which provide corresponding bits B4, B5, B6 and B7 (or B<7:4>), respectively. Also, VO3 is provided to a first input and VO4 is provided to a second input of each of the third set of dynamic comparators CMP8-CMP11, which provide corresponding bits B8, B9, B10 and B11 (or B<11:8>), respectively. Finally, VO4 is provided to a first input and VO5 is provided to a second input of each of the fourth set of dynamic comparators CMP12-CMP15, which provide corresponding bits B12, B13, B14 and B15 (or B<15:12>), respectively.

The dynamic comparators CMP0-CMP15 are also organized into multiple groups in which each dynamic comparator group includes a corresponding dynamic comparator from each of the dynamic comparator sets and is configured according to a corresponding one of the multiple splitting ratios. The dynamic comparators CMP3, CMP7, CMP11 and CMP15 form a first group configured according to a 3×1 splitting ratio, the dynamic comparators CMP2, CMP6, CMP10 and CMP14 form a second group configured according to a 2×2 splitting ratio, the dynamic comparators CMP1, CMP5, CMP9 and CMP13 form a third group configured according to a 1×3 splitting ratio, and the dynamic comparators CMP0, CMP4, CMP8 and CMP12 form a fourth configured according to a 0×4 splitting ratio.

The first group of the dynamic comparators CMP3, CMP7, CMP11, and CMP15 are each coupled according to the 3×1 splitting ratio that combines 3× times the output of the first of a corresponding sequential pair of the passive summers with 1× times the output of the second of the pair of passive summers. This essentially means that the output of the first of the pair is weighted 3 times that of the output of the second. Thus, the dynamic comparator CMP3 receives 3× the output VO2 from the passive summer 204 and receives 1× the output VO1 from the passive summer 202 for developing the bit B3, the dynamic comparator CMP7 receives 3× the output VO3 from the passive summer 206 and receives 1× the output VO2 from the passive summer 204 for developing the bit B7, the dynamic comparator CMP11 receives 3× the output VO4 from the passive summer 208 and receives 1× the output VO3 from the passive summer 206 for developing the bit B11, and the dynamic comparator CMP15 receives 3× the output VO5 from the passive summer 210 and receives 1× the output VO4 from the passive summer 208 for developing the bit B15.

The second group of the dynamic comparators CMP2, CMP6, CMP10, and CMP14 are each coupled according to the 2×2 splitting ratio that combines 2× times the output of the first of a corresponding sequential pair of the passive summers with 2× times the output of the second of the pair of passive summers. This essentially means that the outputs of the pair are equally weighted. Thus, the dynamic comparator CMP2 equally weighs the outputs VO1 and VO2 from the passive summers 202 and 204 for developing the bit B2, the dynamic comparator CMP6 equally weighs the outputs VO2 and VO3 from the passive summers 204 and 206 for developing the bit B6, the dynamic comparator CMP10 equally weighs the outputs VO3 and VO4 from the passive summers 206 and 208 for developing the bit B10, and the dynamic comparator CMP14 equally weighs the outputs VO4 and VO5 from the passive summers 208 and 210 for developing the bit B14.

The third group of dynamic comparators CMP1, CMP5, CMP9, and CMP13 are each coupled according to the 1×3 splitting ratio that combines 1× times the output of the first of a corresponding sequential pair of the passive summers with 3× times the output of the second of the pair of passive summers. This essentially means that the output of the second of the pair is weighted 3× times that of the output of the first. Thus, the dynamic dynamic comparator CMP1 receives 1× the output VO2 from the passive summer 204 and receives 3× the output VO1 from the passive summer 202 for developing the bit B1, the dynamic comparator CMP5 receives 1× the output VO3 from the passive summer 206 and receives 3× the output VO2 from the passive summer 204 for developing the bit B5, the dynamic comparator CMP9 receives 1× the output VO4 from the passive summer 208 and receives 3× the output VO3 from the passive summer 206 for developing the bit B9, and the dynamic comparator CMP13 receives 1× the output VO5 from the passive summer 210 and receives 3× the output VO4 from the passive summer 208 for developing the bit B13.

The fourth group of the dynamic comparators CMP0, CMP4, CMP8, and CMP12 are each coupled according to the 0×4 splitting ratio that combines 0× times the output of the first of a corresponding sequential pair of the passive summers with 4× times the output of the second of the pair of passive summers. This essentially means that only the second passive summer of the pair is represented at its output. Thus, the dynamic dynamic comparator CMP0 represents only the output VO1 from the passive summer 202 and does not represent the output VO2 from the passive summer 204 for developing B0. Similarly, the dynamic comparators CMP4, CMP8, and CMP12 only represent the outputs VO2, VO3, and VO4 from the passive summers 204, 206, and 208, respectively, for developing the bits B4, B8 and B12, respectively.

In summary, the passive summers 202-210 effectively subdivide the overall voltage range into 4 voltage subranges between each sequential passive summer pair, and the dynamic comparators CMP0-CMP15 effectively interpolate each voltage subrange into another 4 voltage subranges for a total of 16 quantized voltage levels within the overall voltage range. Given equal graduated gains and splitting ratios, the overall voltage range is equally subdivided into 16 equally spaced quantized voltage levels.

In operation, in response to a pulse of CK, the controller 212 generates a first pulse on PHI-1 for a first phase, followed by a second pulse on PHI-2 for a second phase, so that the passive summers 202-210 develop the output voltages VO1-VO5 during the second phase while PHI-2 is asserted. Near the end of the second phase while PHI-2 is still asserted, the clock generator 216 generates the clock signals CLK0, CLK1, CLK2 and CLK3 in a staggered manner for clocking the respective groups of the dynamic comparators CMP0-CMP15 one group at a time. CLK0 is asserted first to clock the first group of dynamic comparators CMP3, CMP7, CMP11 and CMP15, then CLK1 is asserted second to clock the second group of dynamic comparators CMP2, CMP6, CMP10 and CMP14, CLK2 is asserted third to clock the third group of dynamic comparators CMP1, CMP5, CMP9 and CMP13, and finally CLK3 is asserted fourth to clock the fourth group of dynamic comparators CMP0, CMP4, CMP8 and CMP12. The binary values B0-B15 are developed at the end of the second phase according to a thermometer code representing the sum of the voltages VIN, VINT1 and VINT2 within the overall voltage range. The converter 112 converts the collective binary values into a corresponding digital sample value D at the end of PHI-2.

Figure 3:
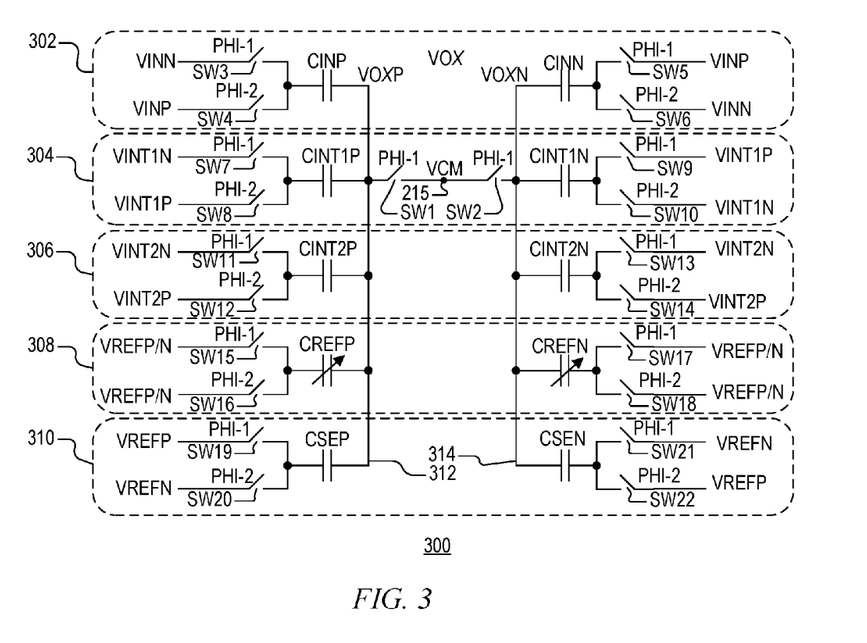
FIG. 3 is a schematic diagram of a passiver summer implemented according to one embodiment, which may be used as any one or more and up to all of the passive summers of FIG. 2.

FIG. 3 is a schematic diagram of a passiver summer 300 implemented according to one embodiment, which may be used as any one or more of the passive summers 202-210. The passive summer 300 includes several switched capacitor sample channels, each for sampling a corresponding one of the input voltages in response to PHI-1 and PHI-2. A first sample channel 302 receives and samples the input voltage VIN, a second sample channel 304 receives and samples the output of the first integrator 104, or VINT1, a third sample channel 306 receives and samples the output of the second integrator 106, or VINT2, and a fourth sample channel 308 receives and samples VREF at a corresponding one of the set of graduated gains A (A1-A5) as further described herein. In the illustrated embodiment, the voltages VIN, VINT1, VINT2 and VREF are differential signals, in which each has a positive polarity and a negative polarity. In particular, VIN has a positive polarity VINP and a negative polarity VINN, VINT1 has a positive polarity VINT1P and a negative polarity VINT1N, VINT2 has a positive polarity VINT2P and a negative polarity VINT2N, and VREF has a positive polarity VREFP and a negative polarity VREFN. Each of the switched capacitor sample channels 302-308 are configured to receive the positive and negative polarities of each of the received differential voltages.

It is noted, however, that any one or more of the received voltages may be single-ended in which the negative polarity is a fixed reference voltage level such as 0 Volts (V) or ground (GND). In one embodiment, for example, VIN may instead be a single-ended signal, in which an additional fifth switched capacitor sample channel 310 may be included to shift the result by a corresponding amount based on VREF appropriate for a differential result.

The passiver summer 300 includes a reset switch circuit including a pair of switches SW1 and SW2 each controlled by PHI-1. Unless otherwise specified, each of the switches described herein, including the switches SW1 and SW2, is shown in simplified or idealized form as a normally-open, single-pole, single-throw (SPST) switch having a pair of switched terminals and a control input receiving a control signal. Unless otherwise specified, each control signal has a default negated state (e.g., low) so that the switch is open by default, and in which the switch is closed when the control signal is asserted (e.g., high). A first switched terminal of the switches SW1 and SW2 is connected to the CM voltage node 215 receiving VCM, and the control terminals of both SW1 and SW2 receive PHI-1. The second switched terminal of SW1 is coupled to a node 312 developing a positive polarity VOXP of a differential output voltage VOX of the passiver summer 300, in which "X" denotes an index from 1 to 5. The second switched terminal of SW2 is coupled to a node 314 developing a negative polarity VOXN of output voltage VOX. Although not specifically shown in FIG. 2, the output voltages VO1-VO5 are differential voltages each having positive and negative polarities coupled to inputs of corresponding ones of the dynamic comparators CMP1-CMP15.

Each sample channel includes positive and negative sample capacitors coupled to the positive and negative polarities VOXP and VOXN, respectively, and positive and negative channel switch circuits that selectively couple a polarity of an input signal to a corresponding one of the sample capacitors. In particular, the sample channel 302 includes 4 switches SW3, SW4, SW5, and SW6 and two sample capacitors CINP and CINN for sampling the differential (or single-ended) signal VIN. SW3 has a first switched terminal receiving VINN, SW4 has a first switched terminal receiving VINP, and the second terminals of SW3 and SW4 are coupled together and to one terminal of the capacitor CINP. The other terminal of CINP is coupled to node 312 developing VOXP. SW5 has a first switched terminal receiving VINP, SW6 has a first switched terminal receiving VINN, and the second terminals of SW5 and SW6 are coupled together and to one terminal of the capacitor CINN. The other terminal of CINN is coupled to node 314 developing VOXN. SW3 and SW5 are controlled by PHI-1 and SW4 and SW6 are controlled by PHI-2.

The sample channels 304, 306 and 310 are each configured in substantially similar manner as the sample channel 302. The sample channel 304 includes switches SW7 SW8, SW9, and SW10 and two sample capacitors CINT1P and CINT1N (coupled in the same manner as the switches SW3-SW6 and capacitors CINP and CINN, respectively) for sampling the differential signal VINT1 (VINT1P, VINT1N). The sample channel 306 includes switches SW11, SW12, SW13, and SW14 and two sample capacitors CINT2P and CINT2N (coupled in the same manner as the switches SW3-SW6 and capacitors CINP and CINN, respectively) for sampling the differential signal VINT2 (VINT2P, VINT2N).

In a similar manner, if included to offset a single-ended VIN of sample channel 302, the sample channel 310 includes switches SW19, SW20, SW21, and SW22 and two sample capacitors CSEP and CSEN (coupled in the same manner as the switches SW3-SW6 and capacitors CINP and CINN, respectively) for sampling the differential signal VREF (VREFP, VREFN). It is noted, however, that the polarity of VREF is reversed for the sample channel 310 as compared to the sample channels 302, 304, and 306. In particular, the switch SW19 applies VREFP to capacitor CSEP and the switch SW21 applies VREFN to capacitor CSEN during the first phase when PHI-1 is asserted. During phase two when PHI-2 is asserted, the switch SW20 applies VREFN to capacitor CSEP and the switch SW22 applies VREFP to capacitor CSEN.

The sample channel 308 receiving VREF is also configured in a similar manner including switches SW15, SW16, SW17, and SW18 and two sample capacitors CREFP and CREFN (coupled in similar manner as the switches SW3-SW6 and capacitors CINP and CINN, respectively) for sampling and scaling the differential signal VREF. In this case, however, the polarity of VREF may be reversed depending upon the particular passive summer being implemented and the corresponding polarity of VREF, symbolically shown as VREFP/N (meaning VREFP or VREFN). Although not shown in FIG. 3, a notation VREFP/N/0 is also used below to represent the case for the passive summer 206 in which the sample channel 308 is either not included, or the switches SW15-SW18 are not switched so that VREF is not applied (e.g., VREF=0). Also, the capacitors CREFP and CREFN are shown as adjustable capacitors, which is intended to mean that the capacitor is adjusted to have a different capacitance depending upon the particular passive summer being implemented. In summary, the capacitances of CREFP and CREFN and the polarity of VREF are both adjusted to implement the particular gain A of the passive summer.

For the passive summer 210 in which A=1 (shown as A5=1), switches SW15 and SW18 each receive VREFP and the switches SW16 and SW17 each receive VREFN (which has a reversed polarity as compared to sample channels 302-306). The capacitors CREFP and CREFN are each implemented with two unit capacitors coupled in parallel, in which each unit capacitor has a "unit" capacitance of CU. In other words, for the passive summer 210, CREFP=CREFN=2*CU. The actual capacitance of each unit capacitor depends upon the particular implementation. The use of a unit capacitance enables relative capacitance to be established between all of the sample channels. In one embodiment, CINP=CINN=CINT1P=CINT1N=CINT2P=CINT2N=CSEP=CSEN=2*CU.

The passive summer 208 has a gain of A=0.5 (shown as A4=0.5) and is configured in substantially the same manner as the passive summer 210 with the VREF polarities VREFP and VREFN coupled in the same manner. In this case, however, the gain is reduced by half by reducing the capacitors CREFP and CREFN by half, or CREFP=CREFN=CU.

The passive summer 206 has a gain of A=0 (shown as A3=0). In this case, the entire VREF sample channel 308 may be eliminated for the passive summer 206; alternatively, if the sample channel 308 is included, then the switches SW15-SW18 remain open during operation effectively removing the sample channel from the circuit.

The passive summer 204 has a gain of A=−0.5 (shown as A2=−0.5). The passive summer 204 is configured in substantially the same manner as the passive summer 208 with CREFP=CREFN=CU (half the sample channel capacitance), except that the VREF polarities VREFP and VREFN are reversed. The passive summer 202 has a gain of −1 (shown as A1=−1) and is configured in substantially the same manner as the passive summer 210 with CREFP=CREFN=2*CU, except that the VREF polarities VREFP and VREFN are reversed.

Operation of the passiver summer 300 is now briefly described. During the first phase when PHI-1 is asserted while PHI-2 remains negated, the switches SW1 and SW2 are closed so that the CM voltage VCM is applied to one terminal of each of the capacitors. Also, the odd-numbered switches SW3, SW5, SW7, SW9, SW11, SW13, SW15, SW17, SW19, and SW21 are closed while the even-numbered switches SW4, SW6, SW8, SW10, SW12, SW14, SW16, SW18, SW20, and SW22 remain open. During phase one while PHI-1 is asserted, the capacitors CINP, CINN, CINT1P, CINT1N, CINT2P, CINT2N, CREFP (other than for the passive summer 206), CREFN (other than for the passive summer 206), CSEP, and CSEN each charged to a difference between VCM and the voltages VINN, VINP, VINT1N, VINT2P, VINT2N, VINT1P, VREFP/N/0, VREFP/N/0, VREFP and VREFN, respectively, in which VREFP/N/0 denotes either VREFP or VREFN for the passive summers 202, 204, 208 and 210, and 0 for the passive summer 206. The first phase during the assertion of PHI-1 may be considered a reset phase in which each sample capacitor is charged relative to the CM voltage VCM.

During the second phase, PHI-1 is negated thus opening SW1 and SW2 and the remaining odd-numbered switches and then PHI-2 are asserted closing the remaining even-numbered switches so that the voltage polarities VINP, VINN, VINT1P, VINT1N, VINT1P, VINT1N, VREFP/N/0, VREFP/N/0, VREFN and VREFP, are effectively added to the capacitors CINP, CINN, CINT1P, CINT1N, CINT2P, CINT2N, CREFP (except the passive summer 206), CREFN (except the passive summer 206), CSEP, and CSEN, respectively. The differential output voltage VOX thus becomes equal to the sum of the differential voltages or VIN+VINT1+VINT2−A*VREF in which the gain A depends upon the particular passive summer as previously described. Also, if VIN is single-ended, then the output result is shifted by VREF by the sample channel 310 to convert to a proper differential level. Towards the end of the second phase, the polarity signals VOXP and VOXN of the differential output voltage VOX are asserted relative to the common mode voltage VCM. In particular, if VOXP is greater than VCM by an offset, then VOXN is less than VCM by the same offset, and vice-versa.

Figure 4:
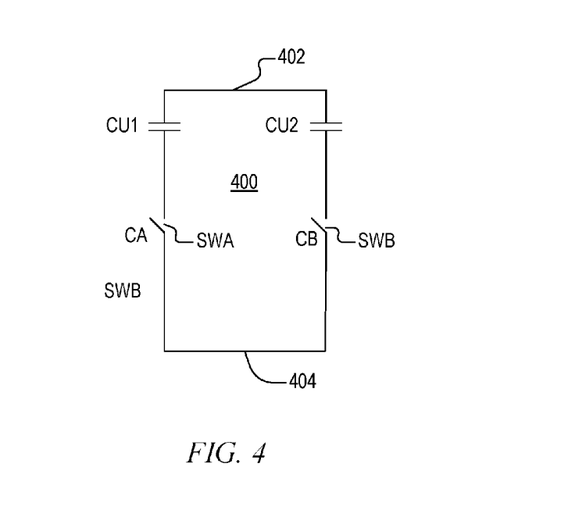
FIG. 4 is a simplified schematic diagram of an adjustable capacitor that may be used for either of the adjustable capacitors shown in FIG. 3.

FIG. 4 is a simplified schematic diagram of an adjustable capacitor 400 that may be used for either of the adjustable capacitors CREFP and CREFN shown in FIG. 3. A first unit capacitor CU1 is coupled in series with a first switch SWA between a first capacitor terminal 402 and a second capacitor terminal 404. Also, a second unit capacitor CU2 is coupled in series with a second switch SWB between the capacitor terminals 402 and 404. SWA is controlled by CA and SWB is controlled by CB. Each of the capacitors CU1 and CU2 have a capacitance of CU. In order to implement a gain of A=+/−0.5, such as for the passive summers 204 or 208, CA is asserted while CB is negated so that the capacitance is CU. In order to implement a gain of A=+/−1, such as for the passive summers 202 or 210, both CA and CB are asserted so that the capacitance is 2*CU. This is true for both capacitors CREFP and CREFN. As described above, the polarity is determined by the polarity of the differential signal VREF applied for the particular passive summer. For a gain of A=0 such as the passive summer 206, either the entire reference sample channel 308 is omitted or the CA and CB remain negated to remove both capacitors CU1 and CU2 from the circuit.

Figure 5:
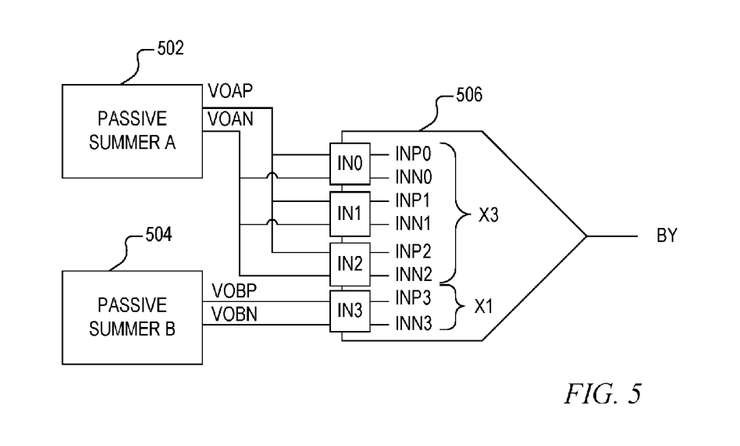
FIG. 5 is a simplified block diagram depicting the coupling of the outputs of a sequential pair of passive summers to inputs of a dynamic comparator configured according to a splitting ratio of 3×1 for a first dynamic comparator group, which may be reconfigured according to a different splitting ratio for the other dynamic comparator groups.

FIG. 5 is a simplified block diagram depicting the coupling of the outputs of a sequential pair of passive summers 502 and 504 to inputs of a dynamic comparator 506 configured according to a splitting ratio of 3×1, such as for any of the first group of dynamic comparators CMP3, CMP7, CMP11 or CMP15. The passive summer 502 is a first passive summer A of the sequential pair having a differential output VOA with positive polarity VOAP and a negative polarity VOAN. The passive summer 504 is a second passive summer B of the sequential pair having a differential output VOB with positive polarity VOBP and a negative polarity VOBN. The sequential pair A & B may represent any of the sequential pair of passive summers 204 & 202 (coupled to CMP3), or 206 & 204 (coupled to CMP7), or 208 & 206 (coupled to CMP11), or 210 & 208 (coupled to CMP15). The dynamic comparator 506 represents a corresponding one of the dynamic comparators CMP0-CMP15 having an output asserting an output bit BY representing a corresponding one of the bits B0-B15 shown in FIG. 2 (e.g., Y is any integer value in the range of 0 to 15, or more generally, 0 to N in which N is any positive integer greater than one).

The dynamic comparator 506 includes 4 differential inputs IN<3:0>, in which the first input IN0 includes a positive polarity input INP0 and a negative polarity input INN0, the second input IN1 includes a positive polarity input INP1 and a negative polarity input INN1, the third input IN2 includes a positive polarity input INP2 and a negative polarity input INN2, and the third input IN3 includes a positive polarity input INP3 and a negative polarity input INN3. In order to configure a splitting ratio of 3×1 as shown, the positive polarity output VOAP of the passive summer 502 is coupled to the positive polarity of the inputs IN0, IN1 and IN2, and the negative polarity output VOAN is coupled to the negative polarity of the inputs IN0, IN1 and IN2 of the dynamic comparator 506. Also, the positive polarity output VOBP of the passive summer 504 is coupled to positive polarity of the input IN3, and the negative polarity output VOBN is coupled to the negative polarity of input IN3 of the dynamic comparator 506. In this manner, the passive summer 502 is weighted three times that of the passive summer 504 for the splitting ratio of 3×1.

The other splitting ratios 0×4, 1×3 and 2×2 are configured in an analogous manner. For a splitting ratio of 0×4, VOBP is coupled to the positive polarity of each of the inputs IN0-IN3, and VOBN is coupled to the negative polarity of each of the inputs IN0-IN3 of the dynamic comparator 504, whereas the outputs of the passive summer 502 are not coupled at all. The splitting ratio of 1×3 is configured by coupling VOAP and VOAN to only one positive and negative polarity input pair, while VOBP and VOBN are coupled to three positive and negative polarity input pairs. The splitting ratio of 2×2 is configured by coupling VOAP and VOAN to two positive and negative polarity input pairs and by coupling VOBP and VOBN to the remaining two positive and negative polarity input pairs of the dynamic comparator 506.

Figure 6:
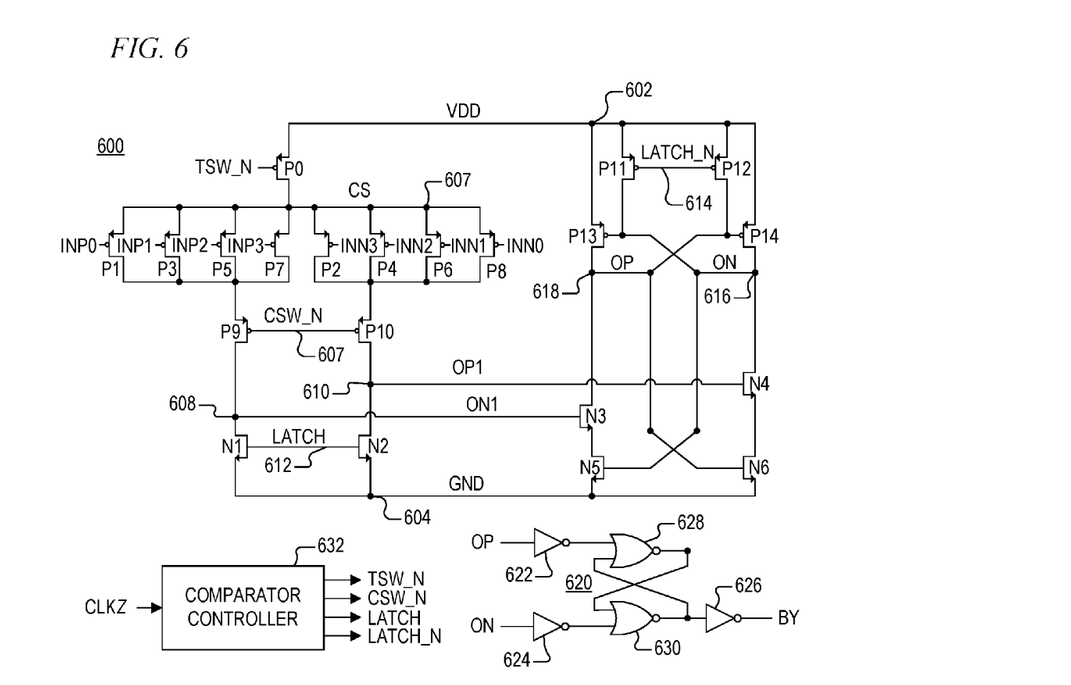
FIG. 6 is a more detailed schematic and block diagram of a dynamic comparator implemented according to one embodiment of the present invention, which may be used to implement the dynamic comparator of FIG. 5 or any of the dynamic comparators of FIG. 2.

FIG. 6 is a more detailed schematic and block diagram of a dynamic comparator 600 implemented according to one embodiment of the present invention, which may be used to implement the dynamic comparator 506 or any of the dynamic comparators CMP0-CMP15. The dynamic comparator 600 is shown implemented between source voltages VDD and GND provided on source nodes 602 and 604, respectively. A P-channel transistor P0 has its source terminal coupled to VDD, its drain terminal coupled to a node 606 developing a voltage CS, and its gate terminal receiving a signal TSW_N. P0 is charge device that initially charges the charge node CS high between comparison cycles of the dynamic comparator 600. A set of 8 P-channel transistors P1-P8 each have their source terminals coupled to node 606. The 4 odd-numbered transistors P1, P3, P5 and P7 have their drain terminals coupled to the source terminal of a P-channel transistor P9 and the 4 even-numbered transistors P2, P4, P6 and P8 have their drain terminals coupled to the source terminal of another P-channel transistor P10. The transistors P1-P8 are input transistors for receiving the 4 differential output signals of one or of both of a sequential pair of the passive summers 202-210. The gate terminals of the odd-numbered transistors P1, P3, P5 and P7 form the positive polarity inputs INP<3:0>, and the gate terminals of the even-numbered transistors P2, P4, P6 and P8 form the negative polarity inputs INN<3:0> of the dynamic comparator 600.

The gate terminals of P9 and P10 are coupled together at a node 607 receiving a signal CSW_N. P9 has its drain terminal coupled to a preliminary output node 608 developing a signal ON1, and P10 has its drain terminal coupled to another preliminary output node 610 developing a signal OP1. Node 608 is coupled to the drain terminal of an N-channel transistor N1 and node 610 is coupled to the drain terminal of another N-channel transistor N2. The gate terminals of N1 and N2 are coupled together at a node 612 receiving a signal LATCH. The source terminals of N1 and N2 are coupled to GND. N1 and N2 are each discharge devices that are initially turned on while the charge device P0 is turned off to discharge the preliminary outputs ON1 and OP1 and the charge node CS low during a RESET period as further described herein.

A set of 4 P-channel transistors P11-P13 each have their source terminals coupled to VDD. The gate terminals of P11 and P12 are coupled together at a node 614 receiving a signal LATCH_N. The drain terminal of P11 is coupled the gate terminal of P13 at an output node 616 developing a signal ON, and the drain terminal of P12 is coupled to the gate terminal of P14 at another output node 618 developing a signal OP. P13 has its drain terminal coupled to node 618, which is further coupled to the drain terminal of an N-channel transistor N3 and to the gate terminal of an N-channel transistor N6. P14 has its drain terminal coupled to node 616, which is further coupled to the drain terminal of an N-channel transistor N4 and to the gate terminal of an N-channel transistor N5. The gate terminal of N3 is coupled to node 608 for receiving ON1, and the gate terminal of N4 is coupled to node 610 for receiving OP1. The source terminal of N3 is coupled to the drain terminal of N5, which has its source terminal coupled to GND. The source terminal of N4 is coupled to the drain terminal of N6, which has its source terminal coupled to GND.

The dynamic comparator 600 further includes an output latch 620, which includes logic inverter gates 622, 624 and 626 and 2-input logic NOR gates 628 and 630. OP is provided to the input of inverter 622, having its output coupled to one input of the NOR gate 628. ON is provided to the input of inverter 624, having its output coupled to one input of the NOR gate 630. The NOR gates 628 and 630 are cross-coupled, in which the output of NOR gate 628 is coupled to the other input of NOR gate 630 and the output of NOR gate 630 is coupled to the other input of the NOR gate 628. The output of the NOR gate 630 is further coupled to the input of inverter 626, having its output providing the corresponding bit BY. BY represents a corresponding one of the bits B0-B15.

The dynamic comparator 600 further includes a comparator controller 632 receiving a clock signal CLKZ representing any one of the clock signals CLK0, CLK1, CLK2 and CLK3, in which Z is denotes an index from 0 to 3. In response to an operative edge of CLKZ (e.g., rising edge), the comparator controller 632 outputs the control signals TSW_N (to gate of P0), CSW_N (on node 607), LATCH_N (on node 614), and LATCH (on node 612). Operation of the dynamic latch 600 is described below with reference to the timing diagram of FIG. 8.

Figure 7:
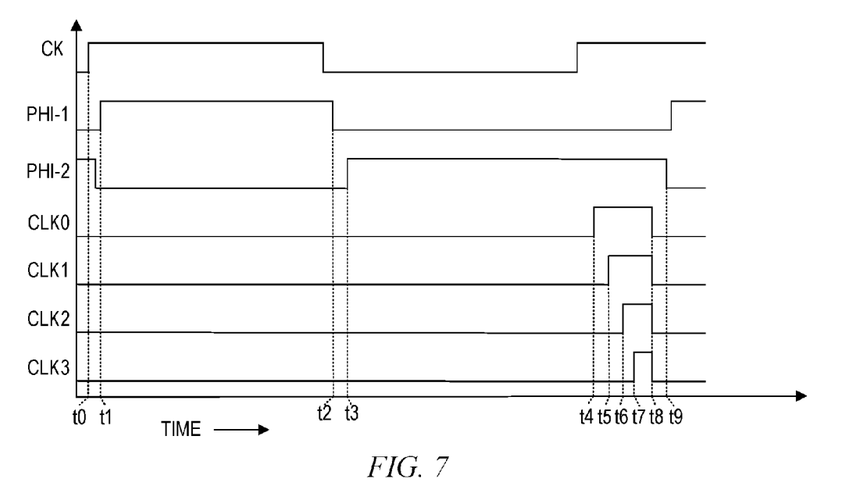
FIG. 7 is a timing diagram illustrating one quantization cycle of the summing quantizer of FIG. 2 during a corresponding cycle of CK according to one embodiment.

FIG. 7 is a timing diagram illustrating one quantization cycle of the summing quantizer 114 during a corresponding cycle of CK. CK is plotted along with PHI-1, PHI-2, and the dynamic comparator staggered clock signals CLK0, CLK1, CLK2 and CLK3, all versus time. It is noted that the timing diagram is simplified in certain respects for illustration; for example, transition delays are not specifically shown. At an initial time t0, CK rises and then PHI-1 is asserted high at a subsequent time t1 to begin phase one while PHI-2 is low. As shown in FIGS. 2 and 3, one end of each capacitor within each of the passive summers 202-210 is reset to VCM while the other end is charged with one polarity of the input signals. At subsequent time t2, such as after a predetermined time, PHI-1 is negated low to end phase one, and then after a short delay at subsequent time t3, PHI-2 is asserted high to initiate phase two. As shown in FIGS. 2 and 3, one end of each sample capacitor within each of the passive summers 202-210 is floated while the other end is charged with the other polarity of the input signals. During phase two after the capacitors finish charging, the passive summer differential output signals VO1-VO5 are developed and provided to the inputs of the dynamic comparators CMP0-CMP15.

At a subsequent time t4 before the end of phase two after the sample capacitors have charged to their final output values, the first clock signal CLK0 is asserted high to energize the first group of dynamic comparators CMP3, CMP7, CMP11 and CMP15, each configured with a splitting ratio of 3×1. After the first group of dynamic comparators have stabilized during phase two while PHI-2 remains asserted, at a time t5 the second clock signal CLK1 is asserted high to energize the second group of dynamic comparators CMP2, CMP6, CMP10 and CMP14, each configured with a splitting ratio of 2×2. After the second group of dynamic comparators have stabilized during phase two while PHI-2 remains asserted, at a subsequent time t6 the third clock signal CLK2 is asserted high to energize the third group of dynamic comparators CMP1, CMP5, CMP9 and CMP13, each configured with a splitting ratio of 1×3. After the third group of dynamic comparators have stabilized during phase two while PHI-2 remains asserted, at a subsequent time t7 the fourth clock signal CLK3 is asserted high to energize the fourth group of dynamic comparators CMP0, CMP4, CMP8 and CMP12, each configured with a splitting ratio of 0×4. After the fourth group of dynamic comparators have stabilized during phase four while PHI-2 remains asserted, at a subsequent time t8, the clock signals CLK0-CLK3 are negated. Soon thereafter at a time t9, PHI-2 is negated to end phase two. The next cycle may begin in response to the next rising edge of CK unless the circuit is held in reset (not shown).

A comparator causes kickback to its input signals which may affect the results and accuracy of the comparison. Conventional designs provide preamplifiers in front of each comparator to suppress kickback. A preamplifier isolates the input voltages from the comparator inputs to reduce kickback effects. Preamplifiers, however, consume valuable circuit space and consume appreciable amounts of power. The present configuration suppresses kickback without the use of preamplifiers. In the present configuration, kickback is suppressed by clock staggering and a windowed reset within each dynamic comparator. Clock staggering, as described more fully in FIG. 8, energizes the dynamic comparators one group at a time to reduce overall kickback applied to each comparator. The windowed reset within each dynamic comparator, implemented by discharging a charge node coupled to the input transistors during a reset period followed by re-charging the charge node high during the compare period back to its original level as described more fully in FIG. 9, effectively eliminates kickback residuals from one comparator group to the next.

Figure 8:
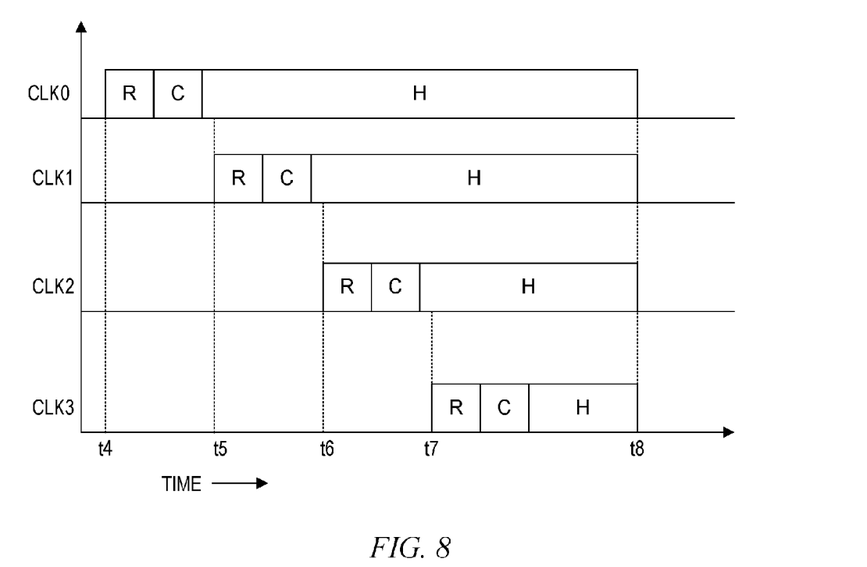
FIG. 8 is a timing diagram more clearly illustrating the staggered clock signals of FIGS. 2 and 7.

FIG. 8 is a timing diagram more clearly illustrating the staggered clock signals CLK0, CLK1, CLK2 and CLK3. It is noted that the timing diagram is simplified in certain respects for illustration; for example, transition delays are not specifically shown. Each clock signal, when asserted, includes an initial RESET period (R) followed by the COMPARE period (C) followed by the HOLD period (H). The RESET and COMPARE periods may each vary from one dynamic comparator to the next. The RESET periods shown in FIG. 8 are simplified to be roughly equal to each other and to a worst case RESET period for each of the dynamic comparators CMP0-CMP15. Similarly, the COMPARE periods shown in FIG. 8 are simplified to be roughly equal to each other and to a worst case COMPARE period for each of the dynamic comparators CMP0-CMP15.

At time t4, CLK0 is asserted high to activate the first group of dynamic comparators CMP3, CMP7, CMP11 and CMP15. Since only 4 dynamic comparators are activated at a time rather than all 16 dynamic comparators CMP0-CMP15, the total amount of kickback is reduced. Also, the initial kickback occurs during the RESET period when no actual comparisons are being performed. The kickback is substantially reduced during the COMPARE period and is substantially eliminated by the end of the COMPARE period as further described herein.

At time t5, CLK1 is asserted high to activate the second group of dynamic comparators CMP2, CMP6, CMP10 and CMP14. When CLK1 is asserted at time t5, the COMPARE periods of the first group of dynamic comparators have completed, and any residual kickback from the first group is eliminated by time t5 when the second group is activated. The same is true for the third group of dynamic comparators CMP1, CMP5, CMP9 and CMP13 activated by CLK2 at time t6, and for the fourth group of dynamic comparators CMP0, CMP4, CMP8 and CMP12 activated by CLK3 at time t7. The staggered clocks CLK0-CLK3 are negated low at time t8 at (or just before) the end of phase two.

Figure 9:
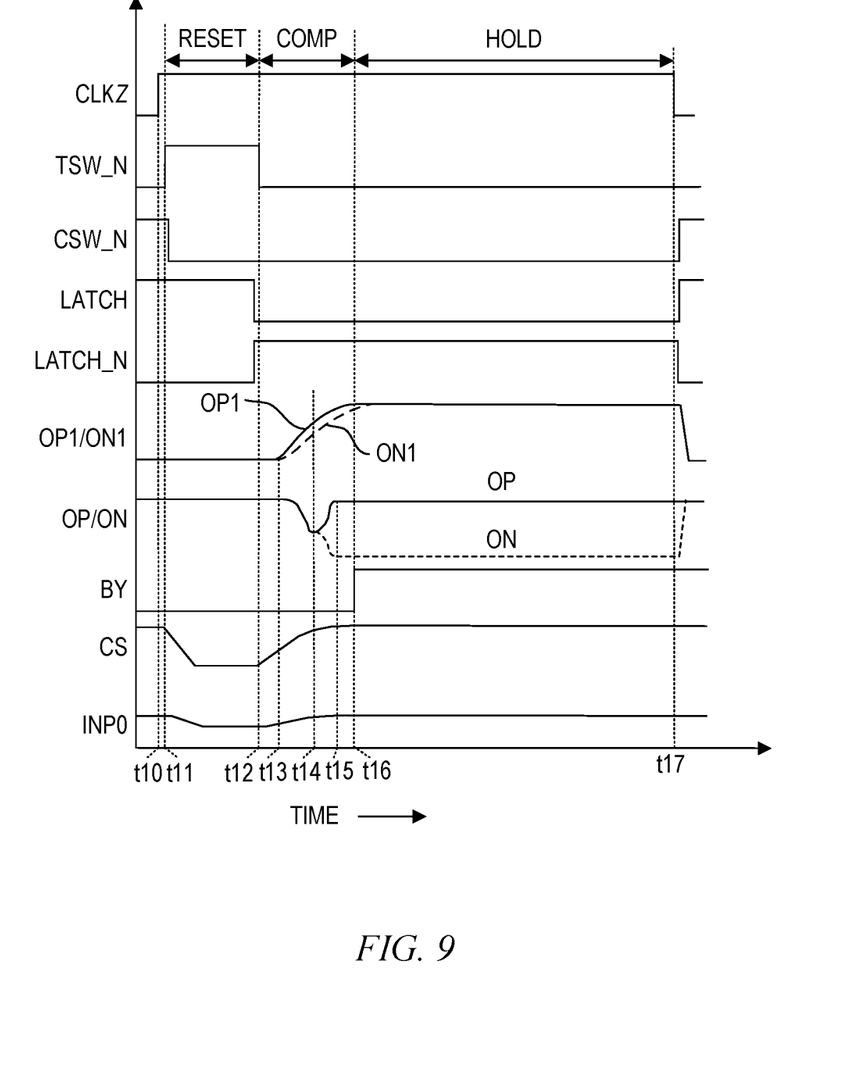
FIG. 9 is a timing diagram illustrating operation of any of the dynamic comparators described herein including windowed reset.

FIG. 9 is a timing diagram illustrating operation of the dynamic comparator 600, representing operation of the dynamic comparator 506 and/or any one of the dynamic comparators CMP0-CMP15, including windowed reset operation. CLKZ is plotted along with TSW_N, CSW_N, LATCH, LATCH_N, OP1/ON1, OP/ON, BY, CS, and an exemplary input INP0, all versus time. It is noted that the timing diagram is simplified in certain respects for illustration; for example, transition delays are not specifically shown. CLKZ represents one of the clock signals CLK0-CLK3, and BY represents a corresponding one of the output bits B0-B15. OP1 and ON1 are superimposed with each other and OP and ON are also superimposed with each other. The clock pulse width of CLKZ (between initial rising edge and next falling edge) varies among the clock signals CLK0-CLK3, in which CLK3 has the narrowest clock pulse width. In any case, the clock pulse width of CLK3 is sufficiently wide to allow output BY of the dynamic comparator 506 to resolve to one of two states, so that the clock pulse widths of each of the remaining clock signals CLK0-CLK2 are also sufficiently wide. INP0 is shown as a representative input signal illustrating the effects of comparator kickback.

Just prior to an initial time t10, CLKZ, TSW_N, LATCH_N, OP1, and ON1 are initially asserted low whereas CSW_N, LATCH, OP, ON, and CS are asserted high. BY is shown initially asserted low from a prior cycle. INP0 is shown at an arbitrary voltage level which ideally should not change during comparator operation, but which does change because of comparator kickback as described herein. With reference to FIG. 5, since TSW_N is low, the charge device P0 is turned on pulling CS high to VDD. Since CSW_N is initially high, P9 and P10 are off, and since LATCH is initially high, N1 and N2 are both turned on pulling both ON1 and OP1 low. Since ON1/OP1 are both low, N3 and N4 are initially off. Since LATCH_N is initially low, P11 and P12 are both on pulling OP and ON high turning off P13 and P14 while pulling the gates of N5 and N6 high. Also, just prior to the assertion of CLKZ, the differential output voltages of the sequential pair of passive summers have settled so that the differential input signals applied to the input transistors P1-P8 have settled to stabilized voltage levels.

At time t10, CLKZ is asserted high to initialize the dynamic comparator 600 to make a comparison between the inputs received according to a corresponding splitting ratio. After a very short delay at a time t11 in response to CLKZ going high, the comparator controller 632 asserts TSW_N high turning off the charge device P0, and then the comparator controller 632 asserts CSW_N low turning on P9 and P10. The switching of TSW_N and CSW_N begins the RESET period starting at about time t11. Since P0 is turned off while P9 and P10 are turned on and while the discharge devices N1 and N2 are also turned on, the source terminals of P9 and P10 are pulled low which pulls the drains of the input transistors P1-P8 low, which pulls CS low towards GND. Although INP0, which is representative of all of the inputs, theoretically should not change to ensure accuracy, INP0 does decrease somewhat in response to CS being pulled low. If all of the comparators CMP0-CMP15 were activated at the same time, the effect on the inputs, including INP0, might be more pronounced. Since, however, only a subset of the comparators (e.g., only 4 of the 16) are activated at the same time, overall kickback is reduced.

After a somewhat longer delay just prior to a time t12, the comparator controller 632 pulls LATCH low turning off N1 and N2 and the comparator controller 632 pulls LATCH_N high turning off P11 and P12. Then at time T12, the comparator controller 632 asserts TSW_N low to turn the charge device P0 back on. The RESET period ends and a COMPARE period begins at time t12 when TSW_N is pulled low. In response to P0 being turned on and the N1/N2 and P11/P12 transistor pairs being turned off, current increases through the drain/source terminals of the input transistors P1-P8 so that both CS and INP0 begin to increase back to their original levels. After a short delay at about time t13 as current continues to increase through the input transistors, ON1 and OP1 begin increasing. The difference between the collective current flowing through the odd-numbered transistors P1, P3, P5 and P7 versus the collective current flowing through the even-numbered transistors P2, P4, P6 and P8 causes one of ON1 and OP1 to increase faster than the other according to the compare function. As shown shortly after time t13, OP1 increases faster than ON1 meaning that the collective set of negative polarity input voltages INN<3:0> is lower than the collective set of positive polarity input voltages applied INP<3:0> (e.g., INP>INN).

The increasing voltage of ON1 after time t13 begins turning on N3, so that the voltage of OP begins decreasing. Similarly, the increasing voltage of OP1 after time t13 begins turning on N4, so that the voltage of ON also begins decreasing. As ON and OP are both decreasing, N5 and N6 are being turned off while P13 and P14 are being turned on. Since OP1 is increasing faster than ON1 resulting in a significant voltage difference between OP1 and ON1 as shown at about a time t14, N4 turns on faster than N3 causing P13 to also turn on faster than P14, so that after time t14, ON continues decreasing while OP stops decreasing and begins increasing. It is significant to note that at about time t14 during comparator action, CS has almost charged to VDD and INP0 has substantially returned to its original voltage level. In this manner, the impact of kickback on the inputs is minimized. The separation of OP and ON is completed at about time t15, in which OP is fully high while ON is fully low. After a short delay at a time t16, the output latch 620 switches to pull the output bit BY high. The COMPARE period ends and a HOLD period begins at about time t16 when BY is switched (or not) to reflect the comparison result. At about time t16, CS and INP0 have returned to their original voltage levels.

When CLKZ is next asserted low at time t17, the HOLD period ends. Just after time t17, the comparator controller 632 returns the dynamic comparator 600 to its initial state so that TSW_N, LATCH_N, OP1, and ON1 are pulled low whereas CSW_N, LATCH, OP and ON are pulled high while BY remains unmodified during the transition. It is noted that at about time t16 (or immediately thereafter), CS and INP0 have returned completely to their original voltage levels, so that any residual effect of kickback is completely eliminated. Any residual effect of kickback is eliminated at the end of the COMPARE period and prior to assertion of a subsequent CLKZ signal for the next group of comparators.

In summary, each dynamic comparator transitions through three periods, including an initial RESET period, an intermediate COMPARE period (COMP), and a last HOLD period that extends to the end of the cycle. When INP>INN, the dynamic comparator 600 asserts OP high and asserts ON low and ultimately asserts BY high. When instead INP<INN, the dynamic comparator 600 asserts OP low and asserts ON high and ultimately asserts BY low. In either case, when CLKZ next goes low, the dynamic comparator 600 returns to its initial state except that BY remains at its latched state as a result of the comparison. The comparator kickback substantially occurs during the RESET period, is minimized during the COMPARE period, and is eliminated at the end of the COMPARE period to eliminate any residual kickback.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. A quantizer, comprising:
   a plurality of passive summers, each configured to sum a plurality of input voltages while subtracting a scaled reference voltage to provide a corresponding one of a plurality of output voltages, wherein said reference voltage is scaled by a corresponding one of a plurality of graduated gains that divide a predetermined voltage range into a plurality of voltage subranges each defined between a sequential pair of output voltages of said plurality of passive summers;
   a plurality of dynamic comparators organized into a plurality of interpolated sets of dynamic comparators in which each interpolated set of dynamic comparators compares a pair of output voltages from a corresponding sequential pair of said plurality of passive summers according to a plurality of splitting ratios, wherein each of said plurality of dynamic comparators generates a corresponding one of a plurality of quantization bits for a corresponding one of said plurality of voltage subranges;
   wherein each of said plurality of dynamic comparators, when activated to compare said pair of output voltages, recharges a charge node coupled to said pair of output voltages to return said pair of output voltages to initial voltages; and
   a clock generator that transitions said plurality of passive summers through a first phase and then a second phase of each of at least one quantization cycle, and that generates a plurality of staggered clock signals that activate each of a plurality of groups of said plurality of dynamic comparators one group at a time during said second phase to develop said plurality of quantization bits, wherein each of said plurality of groups of said plurality of dynamic comparators uses a corresponding one of said plurality of splitting ratios.

2. The quantizer of claim 1, wherein said plurality of graduated gains are equally spaced to divide said predetermined voltage range into a plurality of equally spaced voltage subranges, and wherein said plurality of splitting ratios equally divide each of said plurality of voltage subranges into equally spaced quantization levels.

3. The quantizer of claim 1, wherein each of said plurality of passive summers comprises:
   a positive polarity output node and a negative polarity output node;
   a reset switch circuit that couples a common mode voltage node to said positive polarity output node and to said negative polarity output node during said first phase and that decouples said common mode voltage node from said positive polarity output node and from said negative polarity output node during said second phase; and a plurality of switched capacitor sample channels, each comprising:
  a positive sample capacitor coupled between a first node and said positive polarity output node;
  a negative sample capacitor coupled between a second node and said negative polarity output node;
  a positive channel switch circuit that couples a first polarity of a corresponding one of said plurality of input voltages to said first node during said first phase and that couples a second polarity of said corresponding one of said plurality of input voltages to said first node during said second phase; and
  a negative channel switch circuit that couples said second polarity of said corresponding one of said plurality of input voltages to said second node during said first phase and that couples said first polarity of said corresponding one of said plurality of input voltages to said second node during said second phase.

4. The quantizer of claim 3, wherein said plurality of switched capacitor sample channels includes a reference channel receiving said reference voltage, and wherein said plurality of graduated gains is determined by selecting a capacitance value of said first and second channel capacitors of said reference channel and by selecting a polarity of said reference voltage.

5. The quantizer of claim 4, wherein said plurality of graduated gains is determined by selecting at least one multiple of a unit capacitance and by selecting a polarity of said reference voltage.

6. The quantizer of claim 3, wherein one of said plurality of switched capacitor sample channels comprises an input channel receiving a single-ended input voltage, further comprising a single ended shift channel receiving said reference voltage.

7. The quantizer of claim 1, wherein each of said plurality of passive summers sums together a positive polarity of each said plurality of input voltages relative to a common mode voltage to provide a positive output polarity of a corresponding one of said plurality of outputs, and sums together a negative polarity of each said plurality of input voltages relative to said common mode voltage to provide a negative output polarity of said corresponding one of said plurality of outputs.

8. The quantizer of claim 1, wherein each of said plurality of staggered clock signals is provided to activate a corresponding one of said plurality of groups of said plurality of dynamic comparators, and wherein each subsequent group is activated after comparisons performed by dynamic comparators of a previously activated group have completed.

9. The quantizer of claim 1, wherein each of said plurality of dynamic comparators includes a plurality of inputs, wherein an output of a first one of said plurality of passive summers is coupled to a first number of said plurality of inputs of one of said plurality of dynamic comparators, wherein an output of a second one of said plurality of passive summers is coupled to a second number of said plurality of inputs of said one of said plurality of dynamic comparators, and wherein said first number and said second number are selected according to a corresponding one of said plurality of splitting ratios.

10. The quantizer of claim 1, wherein each of said plurality of dynamic comparators comprises:

a plurality of input transistors, each having a current path coupled between said charge node and a preliminary output node, and each having a control terminal receiving one of said plurality of output voltages of said plurality of passive summers;
a charge device coupled between an upper source voltage node and said charge node;
a discharge device coupled between said preliminary output node and a lower source voltage node; and
a controller that turns off said charge device and that turns on said discharge device during said reset period to reduce a voltage of said charge node during a reset period, and that turns on said charge device and that turns off said discharge device to pull said voltage of said charge node to a voltage of said upper source node during a compare period after said reset period.

11. The quantizer of claim 10, wherein a voltage of said one of said plurality of outputs of said plurality of passive summers is modified from an initial value by a corresponding one of said plurality of input transistors during said reset period when said voltage of said charge node is reduced, and wherein said voltage of said one of said plurality of outputs of said plurality of passive summers is returned to said initial value at an end of said compare period when said voltage of said charge node is pulled to said voltage of said upper source node.

12. A method of summing and quantizing a plurality of input voltages, comprising:
  for each of a plurality of graduated gains:
    amplifying a reference voltage by a corresponding one of the graduated gains; and
    summing the plurality of input voltages while subtracting a corresponding one of a plurality of scaled reference voltages to provide a corresponding one of a plurality of output voltages;
    wherein the plurality of graduated gains divides a predetermined voltage range into a plurality of voltage subranges each defined between a corresponding sequential pair of the plurality of output voltages; and
  for each sequential pair of the output voltages:
    comparing the sequential pair of output voltages according to one of a plurality of splitting ratios to provide a corresponding one of a plurality of quantization bits for a corresponding one of the plurality of voltage subranges;
    repeating said comparing for every other one of the plurality of splitting ratios after each of a plurality of staggered time periods; and
    for each said comparing for each of the plurality of splitting ratios, recharging a charge node coupled to the sequential pair of output voltages to minimize any change of the sequential pair of output voltages.

13. The method of claim 12, wherein said summing comprises:
  sampling a first polarity of each of the plurality of input voltages with a corresponding one of a plurality of capacitors referenced to a common mode voltage during a first phase; and
  sampling a second polarity of each of the plurality of input voltages with the corresponding capacitor during a second phase.

14. The method of claim 13, wherein said summing further comprises:

sampling a selected one of positive and negative polarities of the reference voltage by capacitor having a selected capacitance referenced to the common mode voltage during the first phase; and sampling the other polarity of the reference voltage by the capacitor having the selected capacitance during the second phase.

15. The method of claim 12, wherein said scaling a reference voltage by a corresponding one of the graduated gains comprises selecting a polarity of the reference voltage and selecting a multiple of a unit capacitance for sampling the reference voltage.

16. The method of claim 12, wherein said summing comprises charging each of a plurality of sample capacitors with a difference between a common mode voltage and a voltage of a first polarity of a corresponding one of the plurality of input voltages during a first phase, and then adding a voltage of a second polarity of the corresponding one of the plurality of input voltages to a corresponding one of the plurality of sample capacitors during a second phase.

17. The method of claim 12, wherein said comparing the sequential pair of output voltages according to one of a plurality of splitting ratios comprises comparing a first number of a first one of the sequential pair of output voltages with a second number of a second one of the sequential pair of output voltages.

18. The method of claim 17, further comprising determining each of the plurality of splitting ratios by adjusting a ratio between the first and second numbers.

19. The method of claim 12, wherein said comparing the sequential pair of output voltages comprises:

coupling the sequential pair of output voltages to control terminals of transistor devices having current terminals coupled in a charge path coupled to the charge node;

discharging the charge node during a reset period;

recharging the charge node during a compare period; and holding the charge node charged during a hold period until after the plurality of staggered time periods have completed.

20. The method of claim 12, further comprising selecting the plurality of graduated gains to equally divide the predetermined voltage range into a plurality of equal voltage subranges, and selecting the plurality of splitting ratios to divide each voltage subrange into equally spaced quantization levels.

* * * * *